(12) United States Patent
Plankensteiner

(10) Patent No.: US 7,015,678 B2
(45) Date of Patent: Mar. 21, 2006

(54) EFFICIENCY IMPROVEMENT OF DC-DC CONVERTER

(75) Inventor: Manfred Plankensteiner, Germering (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 0 days.

(21) Appl. No.: 10/874,472

(22) Filed: Jun. 22, 2004

(65) Prior Publication Data

US 2005/0280401 A1 Dec. 22, 2005

(51) Int. Cl.
*G05F 1/652* (2006.01)
(52) U.S. Cl. ..................... 323/222; 323/284
(58) Field of Classification Search ........... 323/222, 323/282, 274, 284
See application file for complete search history.

(56) References Cited

U.S. PATENT DOCUMENTS

| | | | | |
|---|---|---|---|---|
| 4,384,321 A | * | 5/1983 | Rippel | 363/124 |
| 4,859,927 A | | 8/1989 | Meijer | 323/284 |
| 5,801,572 A | | 9/1998 | Nakamura | 327/434 |
| 5,852,557 A | * | 12/1998 | Woodward | 363/124 |
| 5,969,514 A | | 10/1999 | Merrill | 323/283 |
| 6,034,514 A | * | 3/2000 | Sakai | 323/225 |
| 6,353,543 B1 | | 3/2002 | Itoh et al. | 363/21.01 |
| 6,437,545 B1 | * | 8/2002 | Sluijs | 323/222 |
| 6,462,962 B1 | | 10/2002 | Cuk | 363/16 |
| 6,487,094 B1 | | 11/2002 | Weng et al. | 363/21.12 |
| 6,636,022 B1 | * | 10/2003 | Sluijs | 323/222 |
| 6,803,749 B1 | * | 10/2004 | Manabe et al. | 323/222 |
| 2003/0038615 A1 | | 2/2003 | Elbamhawy | 323/282 |

FOREIGN PATENT DOCUMENTS

JP 0094246 10/1998

* cited by examiner

Primary Examiner—Bao Q. Vu
(74) Attorney, Agent, or Firm—George D. Saile; Stephen B. Ackerman

(57) ABSTRACT

Actual switching DC—DC converters have disadvantages in specific operating regions due to different reasons for power losses. Large switching transistors provide favorable efficiency at high output currents, but need high currents to charge/discharge the switching transistor's gate, resulting in poor efficiency at low output currents. Small transistors are more efficient at low currents, but are poor at high currents. The disclosed invention changes the size of the MOSFET switching transistors proportional to the output current, thus combining the efficiency of small transistors at low output currents and of large transistors at high output currents.

24 Claims, 5 Drawing Sheets

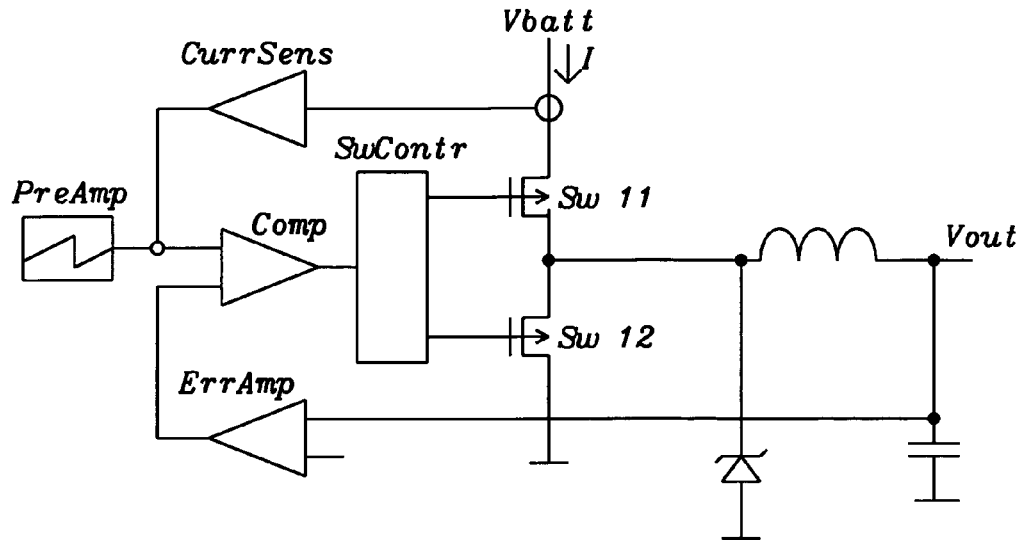
FIG. 1 – Prior Art
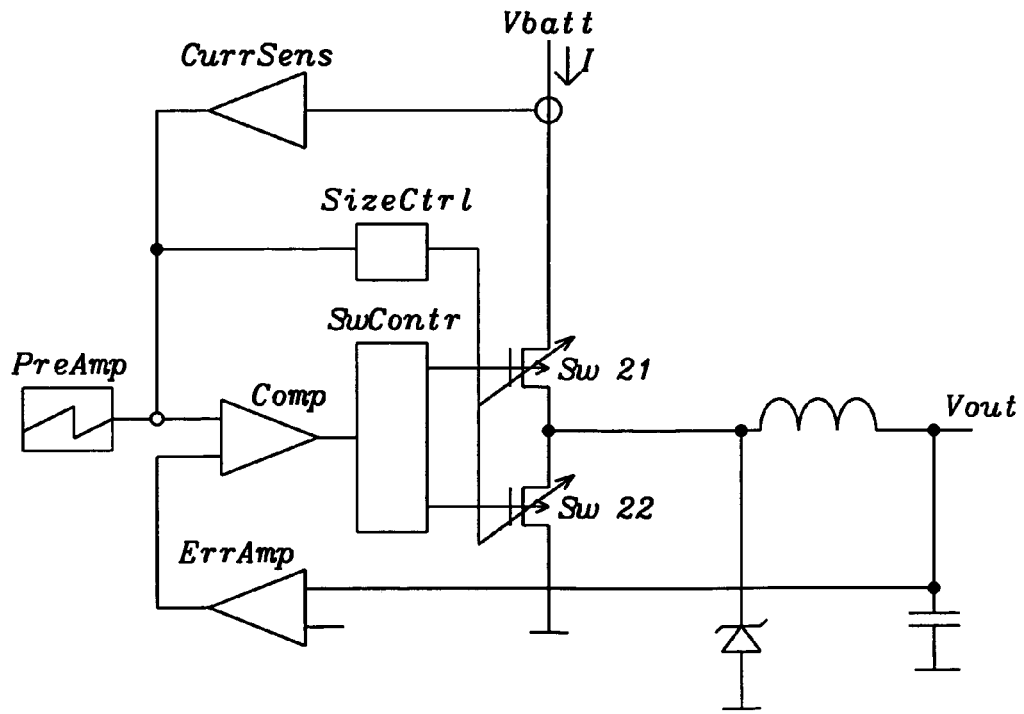
FIG. 2

EFFICIENCY IMPROVEMENT OF DC-DC CONVERTER

BACKGROUND OF THE INVENTION (1) Field of the Invention

The present invention relates to switching DC—DC converters, using CMOS switching transistors.

(2) Description of Prior Art

Actual switching DC—DC converters have disadvantages in specific operating regions due to different reasons for power losses. Large switching transistors with low RDSon provide favorable efficiency at high output currents, but need high currents to charge/discharge the switching transistor's gate, resulting in poor efficiency at low output currents. Small transistors are more efficient at low currents, but as a consequence they are poor at high currents.

FIG. 1 shows one conceptual circuit diagram of a buck converter out of a variety of possible implementations of DC—DC converters.

U.S. Pat. No. 6,462,962 (to Cuk) describes a circuit that implements a lossless switching DC-to-DC converter with lossless switching time control for up to four controllable switches, with each switch meeting the specific current-voltage switching characteristics.

U.S. Pat. No. 6,487,094 (to Weng, et al.) discloses a high efficiency DC—DC power converter, where the voltage across the main switch due to leakage inductance of the transformer is clamped and leakage energy of the transformer is recycled instead of being dissipated so as to improve operating efficiency.

U.S. Pat. No. 4,859,927 (to Meijer) shows a highly efficient switching regulator for a field effect transistor employed in a regulated power supply as the switching element for an unregulated power source, using a pair of complementary control transistors.

SUMMARY OF THE INVENTION

A principal object of the invention is to achieve high energy efficiency for a DC—DC converter at a wide range of converter load currents.

Actual switching DC—DC converters have disadvantages in specific operating regions due to different reasons for power losses. Large switching transistors with low RDSon provide favorable efficiency at high output currents, but need high currents to charge/discharge the switching transistor's gate, resulting in poor efficiency at low output currents. Small transistors are more efficient at low currents, but as a consequence they are poor at high currents due to resistive losses.

In accordance with the objectives of this invention, the disclosed invention changes the size of the switching transistors according to the converter output current, thus combining the efficiency of small transistors at low output currents and of large transistors at high output currents.

Key elements of the disclosed invention are the one or more means for MOSFET switching transistor arrangements, implementing variable size switching transistors. The implementation of said means for MOSFET switching transistor arrangements, implementing variable size switching transistors, will allow to change said transistors size under control of a signal provided to each of said means for MOSFET switching transistor arrangement. Buck Converters have typically two switching transistors, whereas Boost Converters have typically only one switching transistor. Other DC—DC Converters may have one to four switching transistors providing their key power switching function.

The MOSFET switching transistor arrangements can be of the NMOS or of the PMOS transistor type, i.e. there could be a NMOS switching transistor arrangement, implementing a variable size switching transistor and/or a PMOS switching transistor arrangement, implementing a variable size switching transistor, which shall hereafter be called variable size NMOS switching transistor and variable size PMOS switching transistor. If any type and/or any number of said variable size NMOS switching transistors or variable size PMOS switching transistors is considered, it shall hereafter be called variable size MOSFET switching transistors.

To control the size of said variable size MOSFET switching transistors, first appropriate means for sensing a current as a measure for the converter output current take a current probe to provide a measure of the converter output current, with the assistance of additional integrating means, to average said measure over several cycles. Then a logical function in the means to generate a control signal, intended to select the desired size of said variable size MOSFET transistors will decide, based on said averaged measure for the converter output current, what size of each of said variable size MOSFET switching transistors to select at a certain point in time. A selection mechanism will activate the appropriate transistor elements to finally realize said variable size MOSFET transistors with the desired size.

One concept to implement said variable size MOSFET switching transistor is to build a set of small transistors, either of the same or of different sizes, to connect them in parallel and to activate or deactivate each individual transistor element according to the desired total size by enabling or disabling them through a logic function placed at the inputs of their gates.

To achieve the desired steps in the size of said variable size MOSFET switching transistor, one possible solution is to make all gates of equal size. Another solution is to produce gates with sizes stepping with binary values (i.e. 1, 2, 4, 8 etc.). A further solution could be to step said gate sizes in a way to provide a nonlinear curve, for example in steps along a logarithmic curve.

In general, it is desirable to provide a proportional relation between the DC—DC converter's output current and the size of said variable size MOSFET switching transistor. Nevertheless the size of said variable size MOSFET transistors will not change in a steady and linear way, it will change stepwise. Required size of the MOSFET transistor for the highest current will define the size and does not add additional area for the MOSFET transistor.

The method of achieving the goal of improved efficiency of a DC—DC converter is to first provide a measure of the output current of said DC—DC converter, averaged over several power converter cycles; then generating a control signal, based on said averaged output current of said DC—DC converter to change the sizes of said means for said variable size MOSFET transistors; and finally selecting the size of said variable size MOSFET transistors according to said converter output current, i.e. increasing the sizes of said means for variable size MOSFET transistors, when said measure of the output current indicates that said output current of said DC—DC converter increases and decreasing the sizes of said means for variable size MOSFET transistors, when said measure of the output current indicates that said output current of said DC—DC converter decreases.

In accordance with the objectives of this invention, a circuit to implement a DC—DC converter with high energy efficiency at a wide range of converter load currents is achieved.

BRIEF DESCRIPTION OF THE DRAWINGS

In the accompanying drawings, forming a material part of this description, there is shown:

FIG. 1 (Prior Art) shows a conceptual circuit diagram of a buck converter.

FIG. 2 shows the circuit diagram using variable size switching transistors.

DESCRIPTION OF THE PREFERRED EMBODIMENTS

Figure 3:
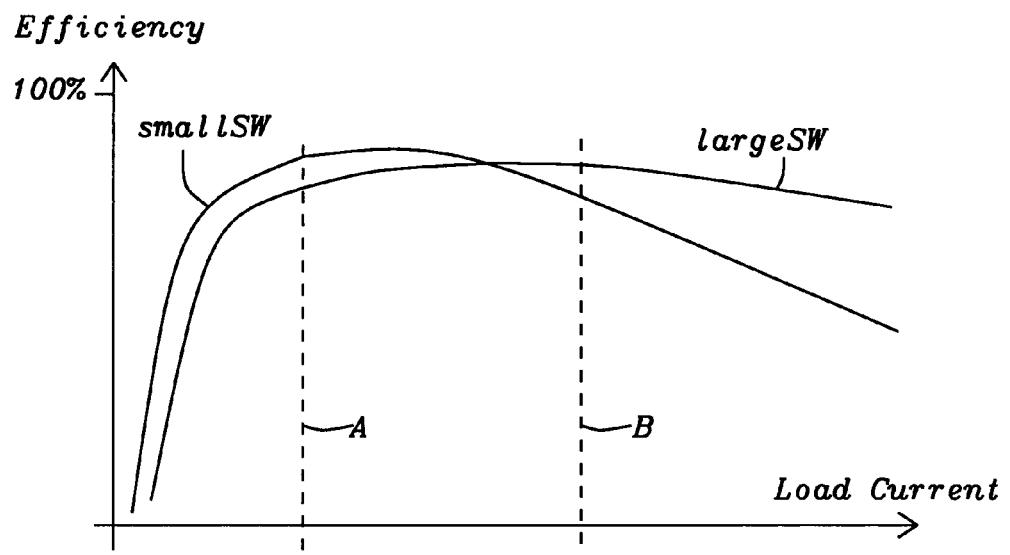
FIG. 3 visualizes the two characteristics of efficiency of a small and of large switching transistors.
Figure 4:
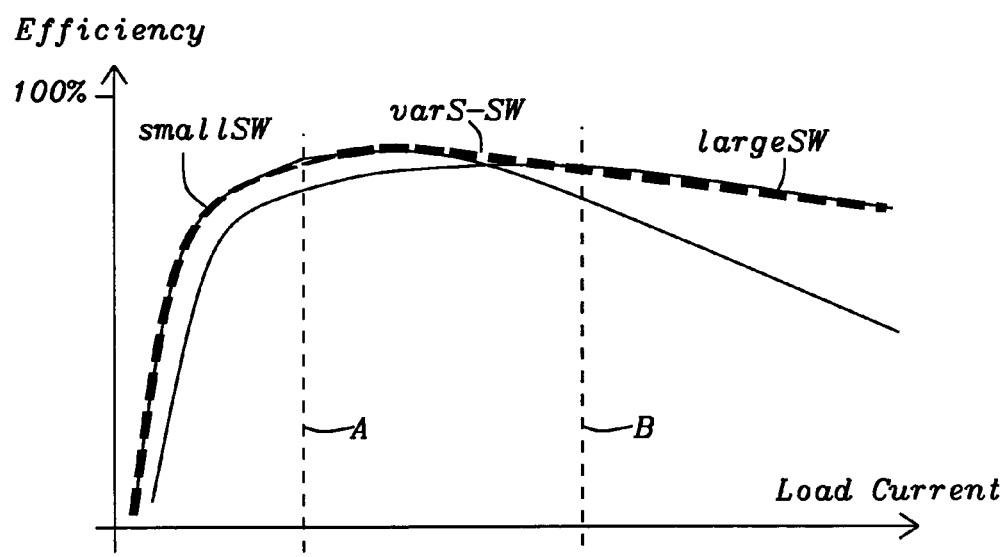
FIG. 4 shows the efficiency characteristic of the variable size switching transistors.

A principal object of the invention is to achieve high energy efficiency for a DC—DC converter at a wide range of converter load currents, which can be achieve by reducing the switching losses of the power switching transistors.

Actual switching DC—DC converters have disadvantages in specific operating regions due to different reasons for power losses. Large switching transistors with low RDSon provide favorable efficiency at high output currents, but need high currents to charge/discharge the switching transistor's gate, resulting in poor efficiency at low output currents. Small transistors are more efficient at low currents, but as a consequence they are poor at high currents.

In accordance with the objectives of this invention, the disclosed invention changes the size of the switching transistors according to the converter output current, thus combining the efficiency of small transistors at low output currents and of large transistors at high output currents.

Key elements of the disclosed invention are the one or more means for MOSFET switching transistor arrangements, implementing variable size switching transistors. The implementation of said means for MOSFET switching transistor arrangements, implementing variable size switching transistors, will allow to change said transistors size under control of a signal provided to each of said means for MOSFET switching transistor arrangement. Boost Converters have typically one switching transistor, whereas Buck Converters have typically two switching transistors. Other DC—DC Converters may have one to four switching transistors providing their key power switching function.

The MOSFET switching transistor arrangements described in this disclosure can be of the NMOS or of the PMOS transistor type, i.e. the variable size MOSFET switching transistors could be a variable size NMOS switching transistor and/or a variable size PMOS switching transistor.

To control the size of said variable size MOSFET switching transistors, first an appropriate current sensor takes a current probe to provide a measure of the converter output current, with the assistance of additional integrating means, to average said measure over several cycles. Then a logical control function will decide, based on said averaged measure for the converter output current, what size of each of said variable size MOSFET switching transistors to select at a certain point of time.

One concept to implement said variable size MOSFET switching transistor is to build a set of small transistors, either of the same or of different sizes, to connect them in parallel and to activate or deactivate each individual transistor element according to the desired total size by enabling or disabling them through a logic function placed at the inputs of their gates.

To achieve the desired steps in the size of said variable size MOSFET switching transistor, one possible solution is to make all gates of equal size. Another solution is to produce gates with sizes stepping with binary values (i.e. 1, 2, 4, 8 etc.). A further solution could be to step said gate sizes in a way to provide a nonlinear curve, for example in steps along a logarithmic curve.

In general, it is desirable to provide a proportional relation between the DC—DC converter's output current and the size of said variable size MOSFET switching transistor. Nevertheless the size of said variable size MOSFET transistors will not change in a steady and linear way, it will change stepwise. Required size of the MOSFET transistor for the highest current will define the size and does not add additional area for the MOSFET transistor.

Representing the family of DC—DC power converters, the basic circuit concept of a buck converter is shown in FIG. 1 (Prior Art). The comparator (Comp) takes the signal from preamplifier (PreAmp), the current sensor (CurrSens) and the error amplifier (ErrAmp), and feeds the result to the switch control (SwContr), which then drives the power switching transistors (Sw 11) and (Sw 12). Other types of DC—DC converters have very similar basic circuit concepts. Essential element is always the power switching transistors, typically with one or two such switches.

To achieve improved power efficiency according to the presented disclosure, each of the power switching transistors are replaced by a MOSFET switching transistor arrangements, implementing variable size switching transistors, as presented in the basic concept drawing of FIG. 2. In the case of implementing the same type of buck converter and in FIG. 1, the variable size MOSFET switching transistors are represented by the variable size NMOS switching transistor (Sw 21) and the variable size PMOS switching transistor (Sw 22). The actual size of said variable size MOSFET switching transistors is controlled through a size controlling function (SizeCtrl), based on said measure of the converter output current, taken from the current sensor (CurrSens).

The diagram in FIG. 3 shows the efficiency depending on the converter output current. For small switching transistors, the efficiency follows the curve small SW, for large transistors, efficiency follows the large SW line. Below the dotted line (A), efficiency primarily depends on the quiescent current of the switching transistor, between lines (A) and (B), charging/discharging the gate is most important and above line (B) the ohmic loss in the power switching transistor is the dominant factor.

When the size of the switching transistor is changed according to the actual load current of the converter, the efficiency takes advantage of small transistors at low output currents and of large transistors at high output current. Efficiency follows the combined curve varS-SW.

Figure 5A:
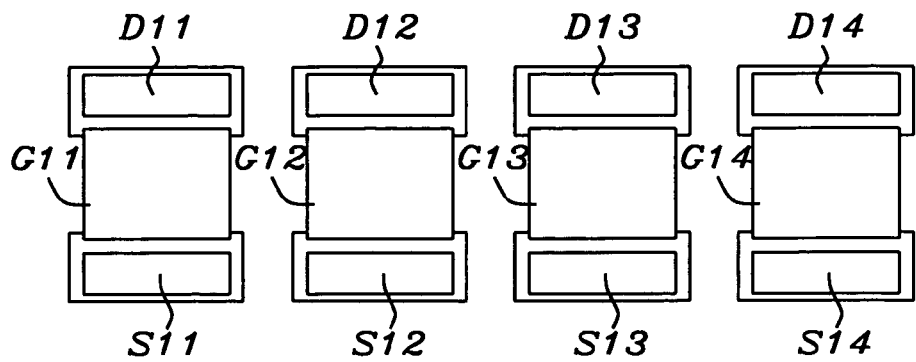
FIG. 5a visualizes the concept of the parallel connection of individual transistors with equal gate sizes.
Figure 5B:
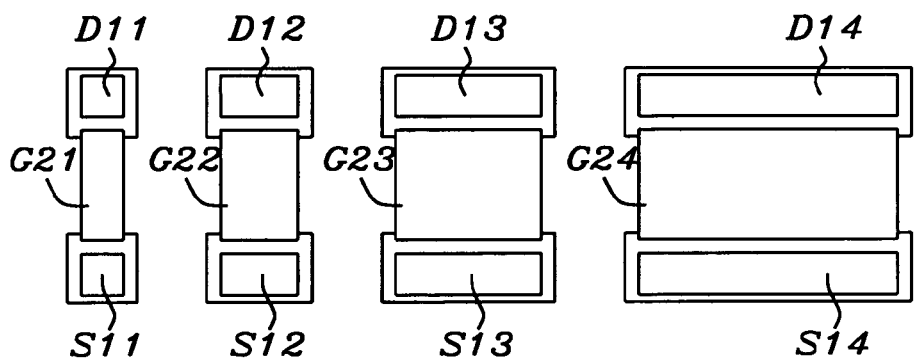
FIG. 5b visualizes the concept of the parallel connection of individual transistors with gate sizes in binary steps.

FIG. 5 and FIG. 6 show the principal concept of a variety of possible implementations on chip level. FIG. 5a visualizes the concept of the parallel connection of individual transistors with equal gate sizes. FIG. 5b is similar, but demonstrates different gate sizes, realizing steps in a binary fashion. S11 to S14 are the source contacts and D11 to D14 are the drain contacts. G11 to G14 are the gates with equal size of the variable size MOSFET switching transistor in FIG. 5a; G21 to G24 are the gates in FIG. 5b with sizes of the variable size MOSFET switching transistor, stepping in a binary fashion.

Figure 6A:
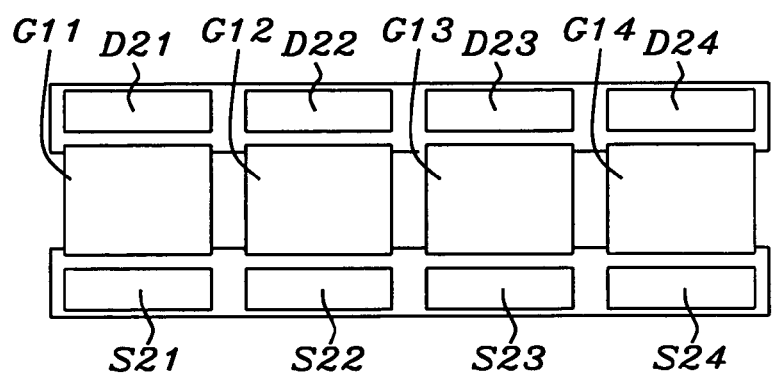
FIG. 6a visualizes the concept of individual transistors with equal gate sizes, and using a combined source and drain region.
Figure 6B:
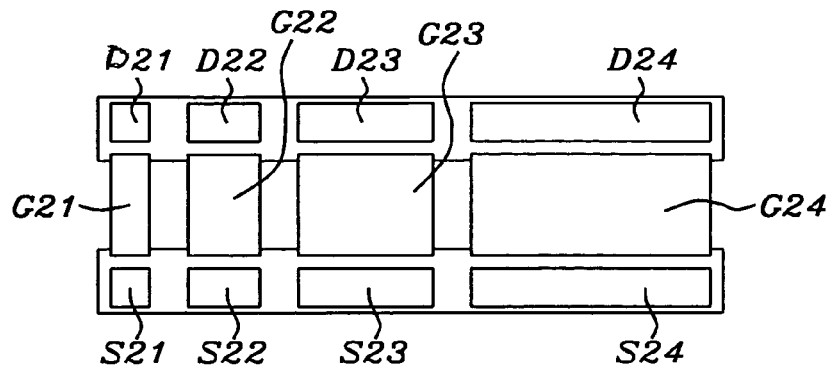
FIG. 6b visualizes the concept of individual transistors with gate sizes in binary steps and using a combined source and drain region.

FIGS. 6a and 6b combine the parallel transistors in a single source region and single drain region, to reduce the space requirement on chip. Again, a version with equal gate sizes (FIG. 6a) and with different gate sizes is shown (FIG. 6b). S21 to S24 are the source contacts and D21 to D24 are the drain contacts. G11 to G14 are the gates with equal size of the variable size MOSFET switching transistor in FIG. 6a; G21 to G24 are the gates in FIG. 6b with sizes of the variable size MOSFET switching transistor, stepping in a binary fashion (size in 1, 2, 4, 8 units). It should be noted: the total size of all portions of said MOSFET switching transistor arrangement is the same size, as it would be for a single MOSFET transistor, designed for the highest output current of said DC—DC converter; the size controlling mechanism either selects the total size of said MOSFET switching transistor arrangement or a fraction thereof.

Figure 7:
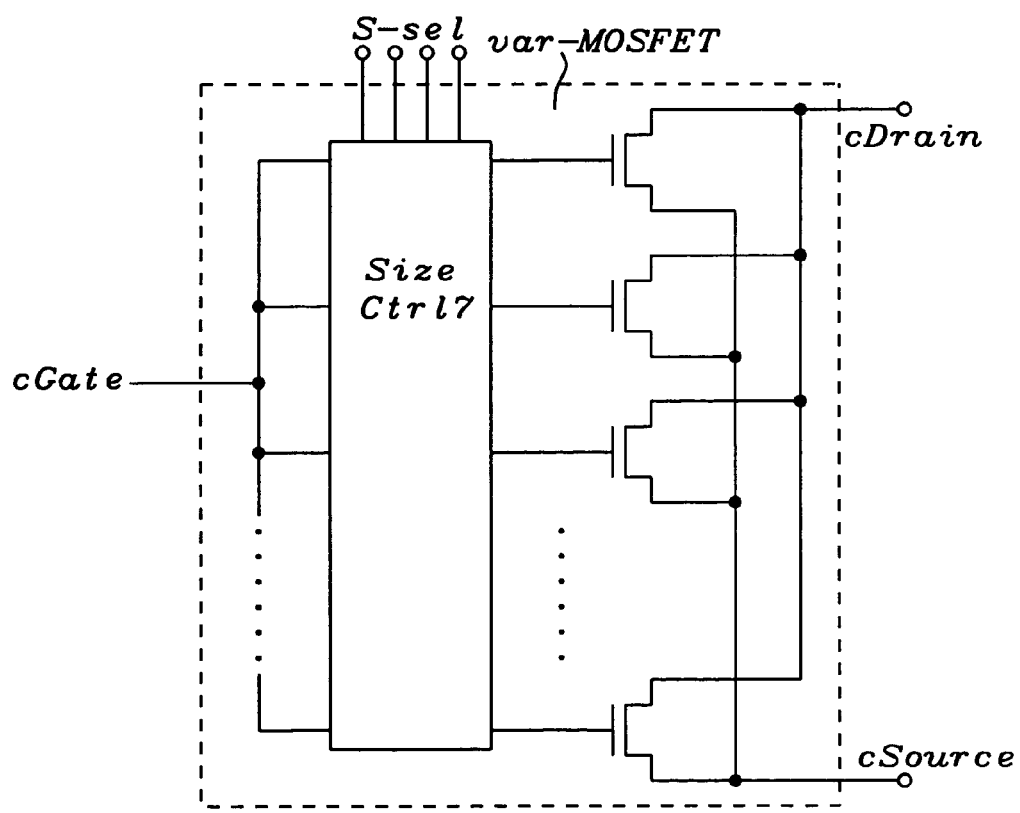
FIG. 7 shows the internal structure of said MOSFET switching transistor arrangement.
Figure 8:
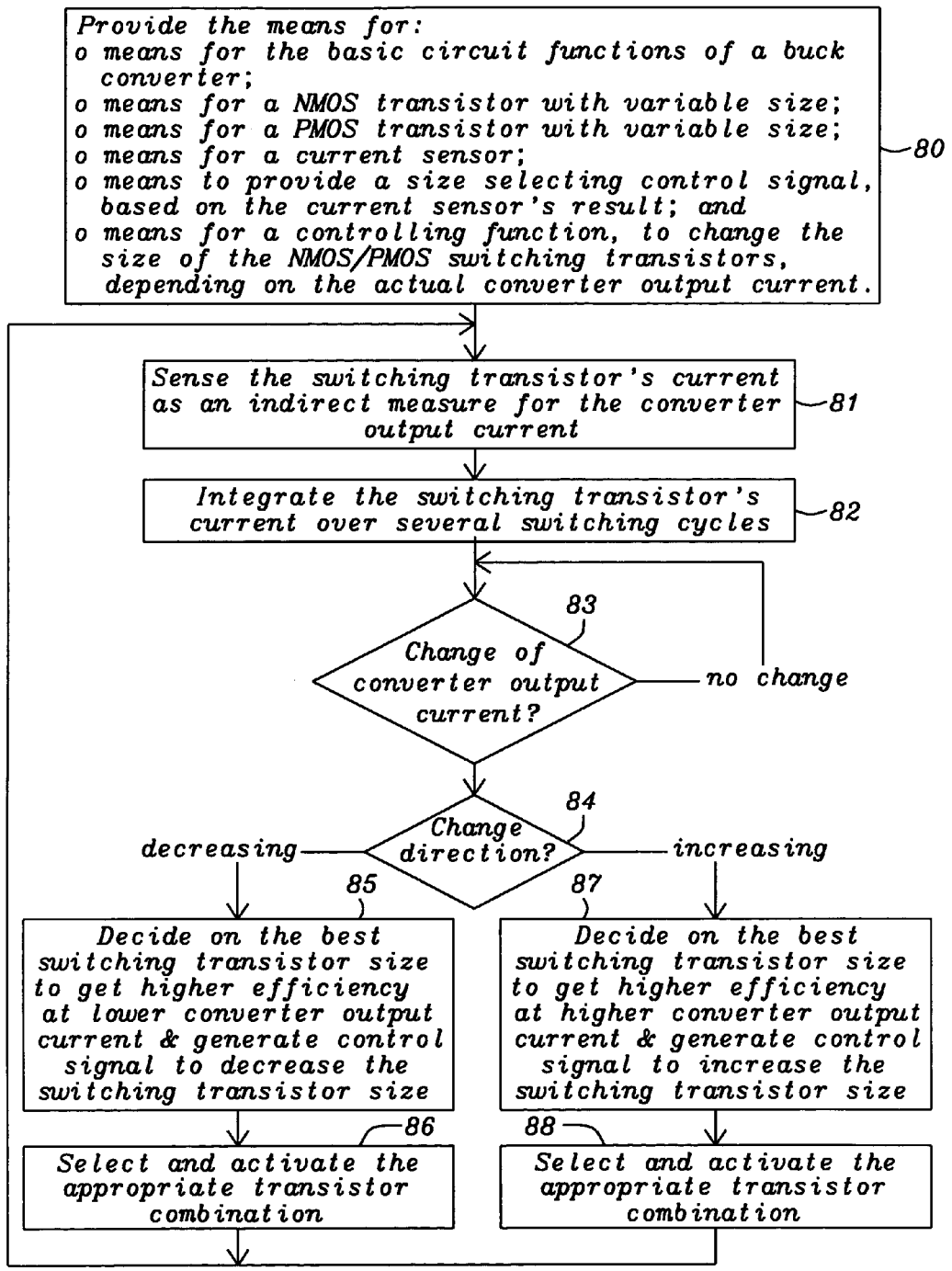
FIG. 8 shows the method to select the appropriate gate size.

The internal structure of said MOSFET switching transistor arrangement, implementing variable size switching transistors (varMOSFET) is presented in FIG. 7. The combined gate (cGate), combined source (cSource) and combined drain (cDrain) build the equivalent gate, source and drain connections. The active size of said variable size MOSFET switching transistor is controlled by a selection mechanism, the size control function (SizeCtrl 7), selecting the desired active size of said MOSFET switching transistor arrangement through the control inputs (S-sel).

The method to improve the efficiency of a DC—DC converter provides the means for the basic circuit functions for a DC—DC converter, for example for a buck converter, the means for a NMOS transistor with variable size, means for a PMOS transistor with variable size, means for a current sensor and an integrater to avarage the measured current; means to provide a size selecting control signal, based on the current sensor's result; and means for a controlling function, to change the size of the NMOS/PMOS switching transistors, depending on the actual converter output current (80). The method first senses the switching transistor's current (81) as an indirect measure for the converter output current and then integrates (82) the switching transistor's current over several switching cycles, typically over 1 to 50 cycles. Then, if said averaged output current significantly changes (83) and decreases (84), the selecting mechanism decides on the best switching transistor size (85) to get higher efficiency at a lower converter output current and generates a control signal to decrease the switching transistor size. Or, if said output current significantly increases (84), the selecting mechanism decides on the best switching transistor size (87) to get higher efficiency at a higher converter output current and generates a control signal to increase the switching transistor size. Finally, the optimized size of said MOSFET switching transistor arrangement is selected and activated (86)(88).

While the invention has been particularly shown and described with reference to the preferred embodiments thereof, it will be understood by those skilled in the art that various changes in form and details may be made without departing from the spirit and scope of the invention.

What is claimed is:

1. A circuit implementing an efficiency improved DC—DC converter, comprising
    means for the basic circuit functions of a DC—DC converter;
    means for one or more MOSFET switching transistor arrangements, each implementing a variable size switching transistors;
    means for sensing a current as a measure for the converter output current;
    means for an integrator function to average said measure for the converter output current over several converter cycles;
    means to generate a control signal, intended to select the desired size of said variable size MOSFET transistors, based on said averaged measure for the converter output current; and
    means for a selection mechanism to activate the appropriate transistor elements to finally realize said variable size MOSFET transistors with the desired size.

2. The circuit of claim 1 wherein the means for the basic circuit functions of a DC—DC converter implements a buck converter, using means for a NMOS switching transistor arrangement and means for a PMOS switching transistor arrangement, each implementing a variable size MOSFET transistor.

3. The circuit of claim 1 wherein the means for the basic circuit functions of a DC—DC converter implements a boost converter, using means for either a NMOS switching transistor arrangement or means for a PMOS switching transistor arrangement, implementing a variable size MOSFET transistor.

4. The circuit of claim 1 wherein the means for a current sensor are positioned in the converter output current path to measure the DC output current.

5. The circuit of claim 1 wherein the means for a current sensor are positioned in series with said variable size MOSFET transistors.

6. The circuit of claim 1 wherein said means for an integrator function averages said measure for the converter output current typically over a period of 1 to 50 power converter cycles, thus providing said averaged measure for the converter output current.

7. The circuit of claim 1 wherein the means to generate a control signal, intended to select the desired size of said variable size MOSFET transistors, based on said averaged measure for the converter output current, provide a proportional relation between said converter output current and said variable size MOSFET transistors.

8. The circuit of claim 1 wherein the means for a MOSFET switching transistor arrangement, implementing variable size switching transistors is implemented as the parallel connection of typically 2 to 8 individual MOSFET transistors, where said individual MOSFET transistors are parallel connected at their source and their drain and where their gates are connected to said means for a selection mechanism to activate the appropriate transistor elements.

9. The circuit of claim 8 wherein said variable size MOSFET transistor, which is implemented as the parallel connection of individual MOSFET transistors uses MOSFET transistors of the same size.

10. The circuit of claim 8 wherein said variable size MOSFET transistor, which is implemented as the parallel connection of individual MOSFET transistors uses MOSFET transistors of the different sizes, for example with the size in binary steps 1, 2, 4, 8 etc.

11. The circuit of claim 8 wherein said variable size MOSFET transistor, which is implemented as the parallel connection of individual MOSFET transistors uses MOSFET transistors of different sizes, specifically designed to match a non-linear stepping curve, like a logarithmic curve.

12. The circuit of claim 1 wherein the means for a MOSFET switching transistor arrangement, implementing variable size switching transistors is implemented as a MOSFET transistor with a single source region and a single drain region, but with several, typically 2 to 8, individual gate regions, and where said individual gates are connected to said means for a selection mechanism to activate the appropriate transistor elements.

13. The circuit of claim 12 wherein said variable size MOSFET transistor, which is implemented as a MOSFET transistor with a single source region and a single drain region, but with several individual gate regions, implements said individual gate regions with the same size.

14. The circuit of claim 12 wherein said variable size MOSFET transistor, which is implemented as a MOSFET transistor with a single source region and a single drain region, but with several individual gate regions, implements said individual gate regions with different sizes, for example with the size in binary steps 1, 2, 4, 8 etc.

15. The circuit of claim 12 wherein said variable size MOSFET transistor, which is implemented as a MOSFET transistor with a single source region and a single drain region, but with several individual gate regions, implements said individual gate regions with different sizes, specifically designed to match a non-linear stepping curve, like a logarithmic curve.

16. A method to improve the efficiency of a DC—DC converter, comprising means for the basic circuit functions of a DC—DC converter, means for one or more variable size MOSFET transistors, means for sensing a current as a measure for the converter output current, means for integrating said measure for the converter output current over several converter cycles, means to generate a control signal, intended to select the desired size of said variable size MOSFET transistors, depending on an averaged measure of said output current of said DC—DC converter and means for a selection mechanism to activate the appropriate transistor elements to finally build said variable size MOSFET transistors with the desired size;
  providing a measure of the output current of said DC—DC converter;
  averaging said measure of the output current over several converter cycles;
  generating a control signal based on said output current of said DC—DC converter to change the sizes of said means for one or more variable size MOSFET transistors; and
  selecting the size of said one or more variable size MOSFET transistors according to said converter output current, i.e. increasing the sizes of said means for variable size MOSFET transistors, when said control signal indicates that said output current of said DC—DC converter increases and decreasing the sizes of said means for variable size MOSFET transistors, when said control signal indicates that said output current of said DC—DC converter decreases.

17. The method of claim 16 wherein providing said measure of the output current of said DC—DC converter measures the output current of said DC—DC converter itself.

18. The method of claim 16 wherein providing said measure of the output current of said DC—DC converter indirectly measures the output current of said DC—DC converter by sensing the switching transistor current.

19. The method of claim 16 wherein averaging said measure of the output current, over several converter cycles, typically integrates over a period of 1 to 50 power converter cycles.

20. The method of claim 16 wherein changing the size of said variable size MOSFET transistor according to said converter output current, follows said converter output current proportionally.

21. The method of claim 16 wherein selecting the size of said one or more variable size MOSFET transistors according to said converter output current selects the size in equal steps, switching on one more of the equally sized transistor elements within said variable size MOSFET transistor.

22. The method of claim 16 wherein selecting the size of said one or more variable size MOSFET transistors according to said converter output current selects the size in equal steps, switching on a binary combination of the transistor elements within said variable size MOSFET transistor, that have sizes in binary steps i.e. 1, 2, 4 etc.

23. The method of claim 16 wherein selecting the size of said one or more variable size MOSFET transistors according to said converter output current selects the size in equal steps, switching on one more of the equally sized transistor elements within said variable size MOSFET transistor.

24. The method of claim 16 wherein selecting the size of said one or more variable size MOSFET transistors according to said converter output current selects the size in non-equal steps, switching on a variable combination of the non-equally sized transistor elements within said variable size MOSFET transistor, that have various sizes, specifically designed to match a non-linear stepping curve, like a logarithmic curve.

* * * * *